(12) United States Patent
Roohparvar

(10) Patent No.: US 7,630,246 B2
(45) Date of Patent: Dec. 8, 2009

(54) PROGRAMMING RATE IDENTIFICATION AND CONTROL IN A SOLID STATE MEMORY

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 11/764,450

(22) Filed: Jun. 18, 2007

(65) Prior Publication Data

US 2008/0310222 A1    Dec. 18, 2008

(51) Int. Cl.
*G11C 16/04* (2006.01)

(52) U.S. Cl. .............................. 365/185.18; 365/185.03; 365/185.22

(58) Field of Classification Search ............ 365/185.18, 365/185.2, 185.22, 185.24, 185.03
See application file for complete search history.

(56) References Cited

U.S. PATENT DOCUMENTS

| | | | |
|---|---|---|---|
| 6,243,290 B1 | 6/2001 | Kurata et al. | |
| 6,829,172 B2 | 12/2004 | Bloom et al. | |
| 6,928,001 B2 | 8/2005 | Avni et al. | |
| 7,154,141 B2* | 12/2006 | Wang et al. | 257/316 |
| 7,483,305 B2* | 1/2009 | Yamada | 365/185.2 |
| 7,486,561 B2* | 2/2009 | Mokhlesi | 365/185.18 |

* cited by examiner

*Primary Examiner*—Gene N. Auduong
(74) *Attorney, Agent, or Firm*—Leffert Jay & Polglaze, P.A.

(57) ABSTRACT

Memory devices adapted to receive and transmit analog data signals representative of bit patterns of two or more bits facilitate increases in data transfer rates relative to devices communicating data signals indicative of individual bits. Programming of such memory devices includes determining a rate of programming (i.e., rate of movement of the respective threshold voltage) of the memory cells and biasing the corresponding bit line with a programming rate control voltage that is greater than the bit line enable voltage and less than the inhibit voltage. This voltage can be adjusted to change the speed of programming. A capacitor coupled to the bit line stores the programming rate control voltage in order to maintain the proper bit line bias for the duration of the programming operation or until it is desired to change the programming rate.

30 Claims, 8 Drawing Sheets

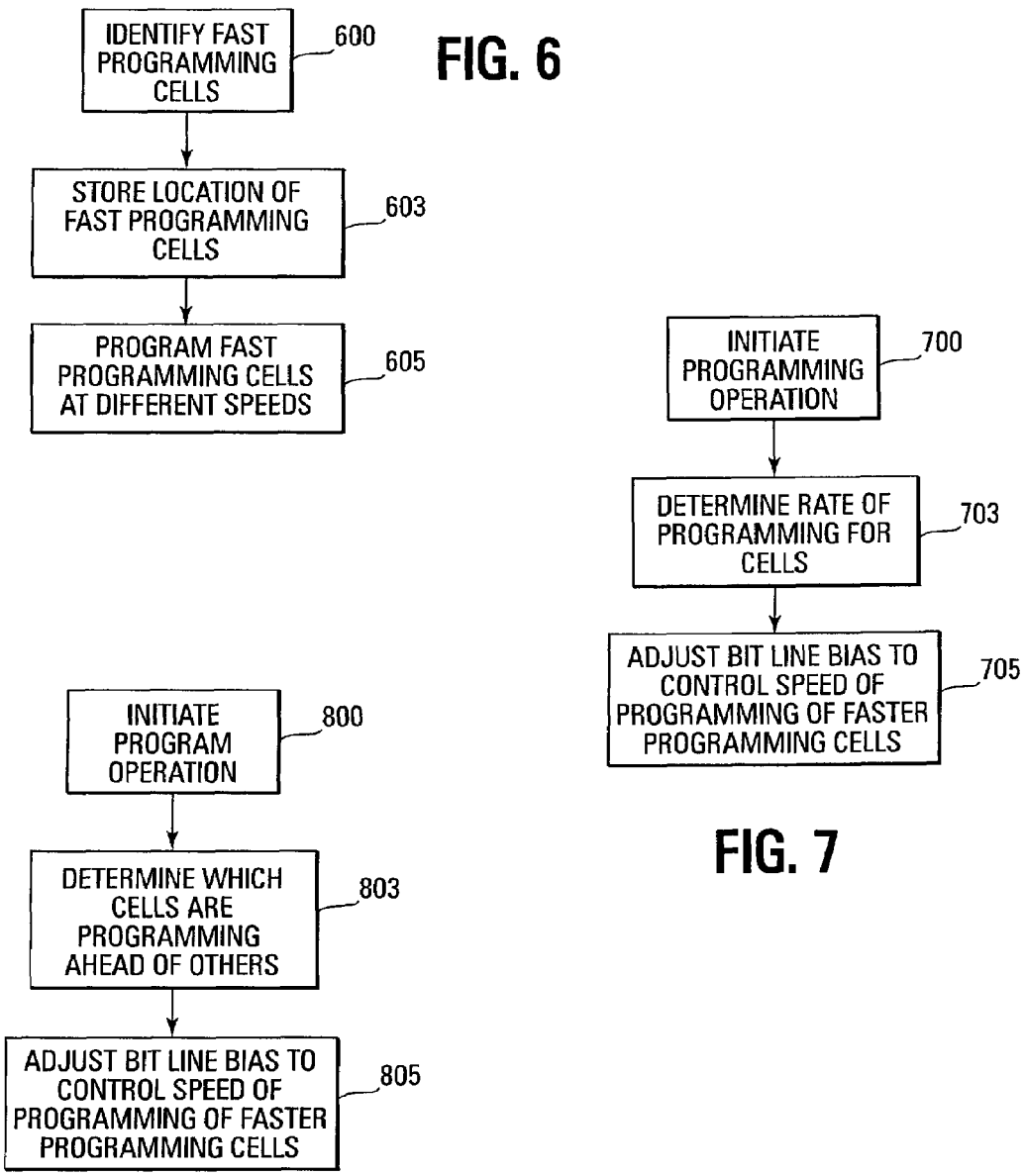

PROGRAMMING RATE IDENTIFICATION AND CONTROL IN A SOLID STATE MEMORY

TECHNICAL FIELD

The present disclosure relates generally to semiconductor memory and, in particular, the present disclosure relates to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons stated below which will become apparent to those skilled in the art upon reading and understanding the present specification, there is a need in the art for alternative bulk storage options.

BRIEF DESCRIPTION OF THE DRAWINGS

FIG. 6 is a flowchart of one embodiment of a programming rate identification and control method for a memory device of the present disclosure.

FIG. 7 is a flowchart of another embodiment of a programming rate identification and control method for a memory device of the present disclosure.

FIG. 8 is a flowchart of an embodiment of a fast memory cell programming identification and control method for a memory device of the present disclosure.

DETAILED DESCRIPTION

Figure 1:
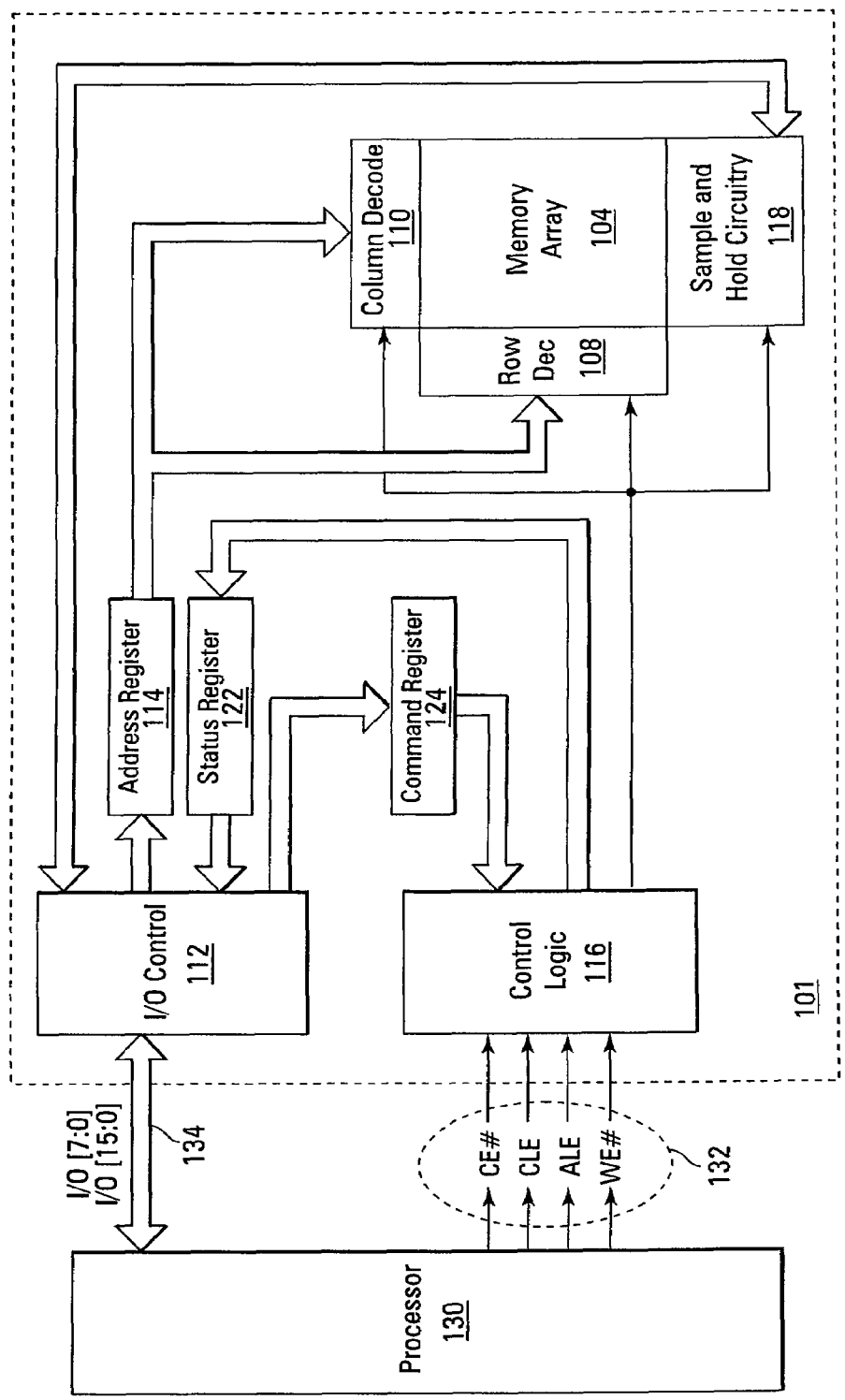
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage ($V_t$) ranges of 200 mV for each range, with each range corresponding to a distinct data state, thereby representing four data values or bit patterns. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the $V_t$ range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as $V_t$ ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
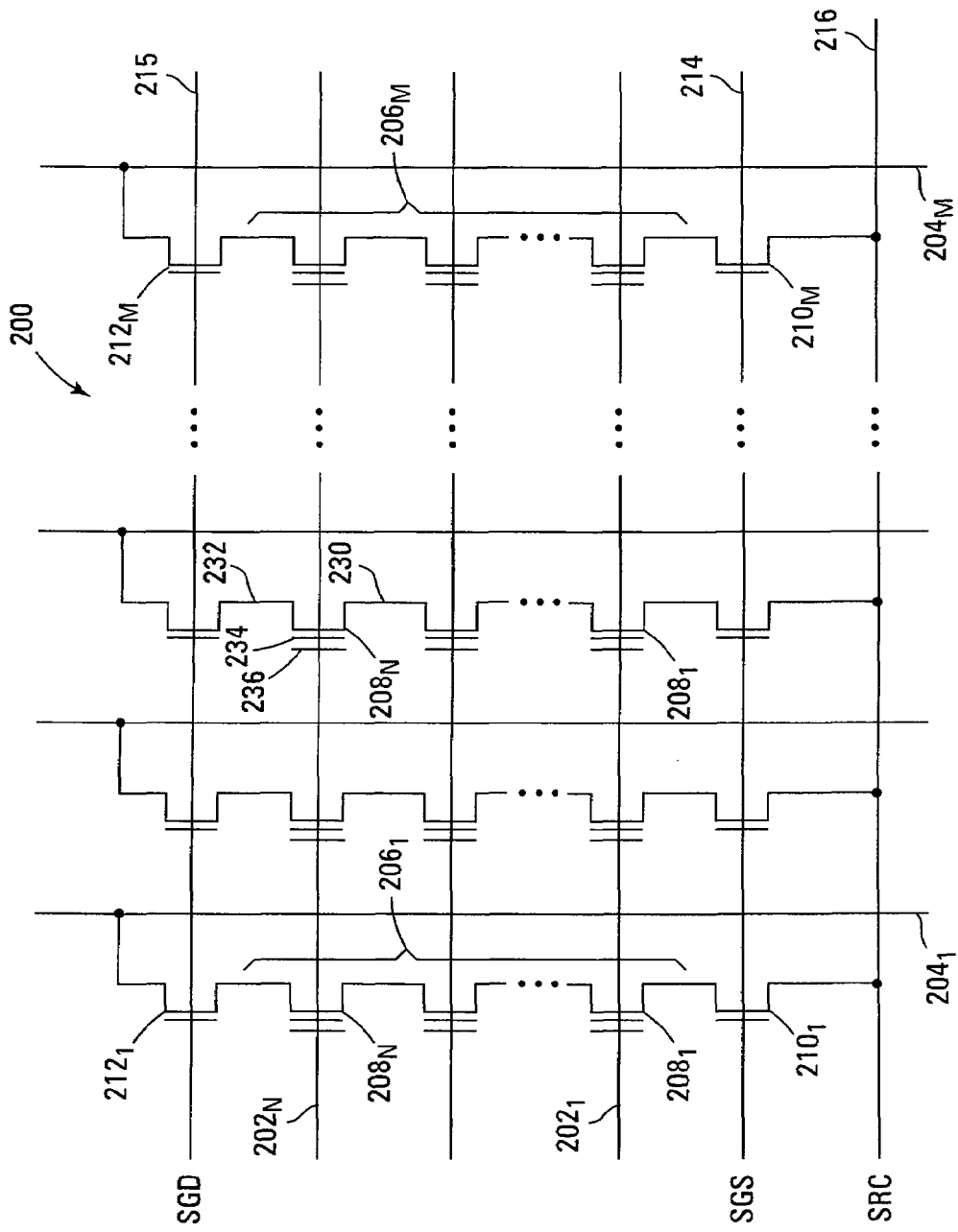
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
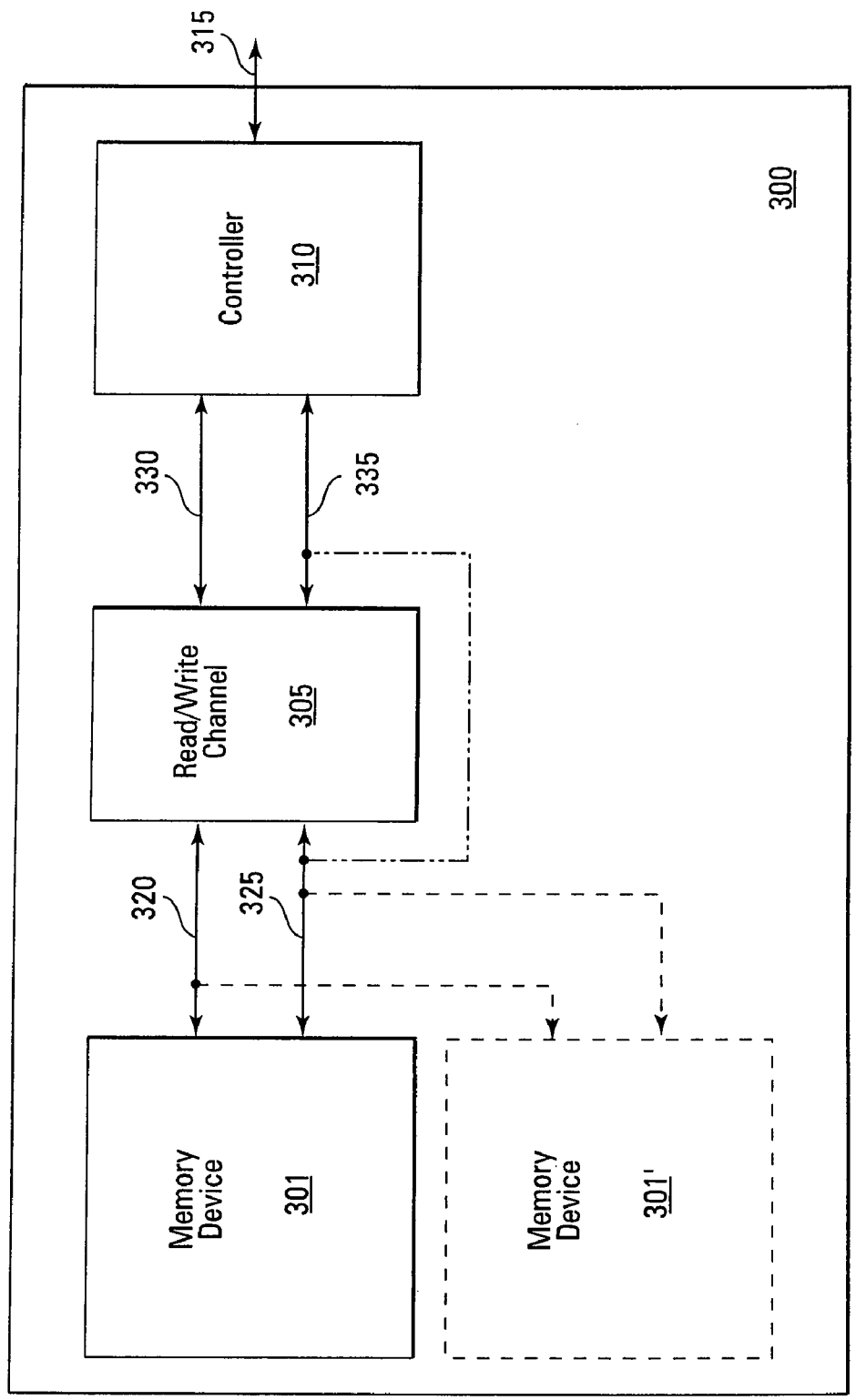
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDS, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
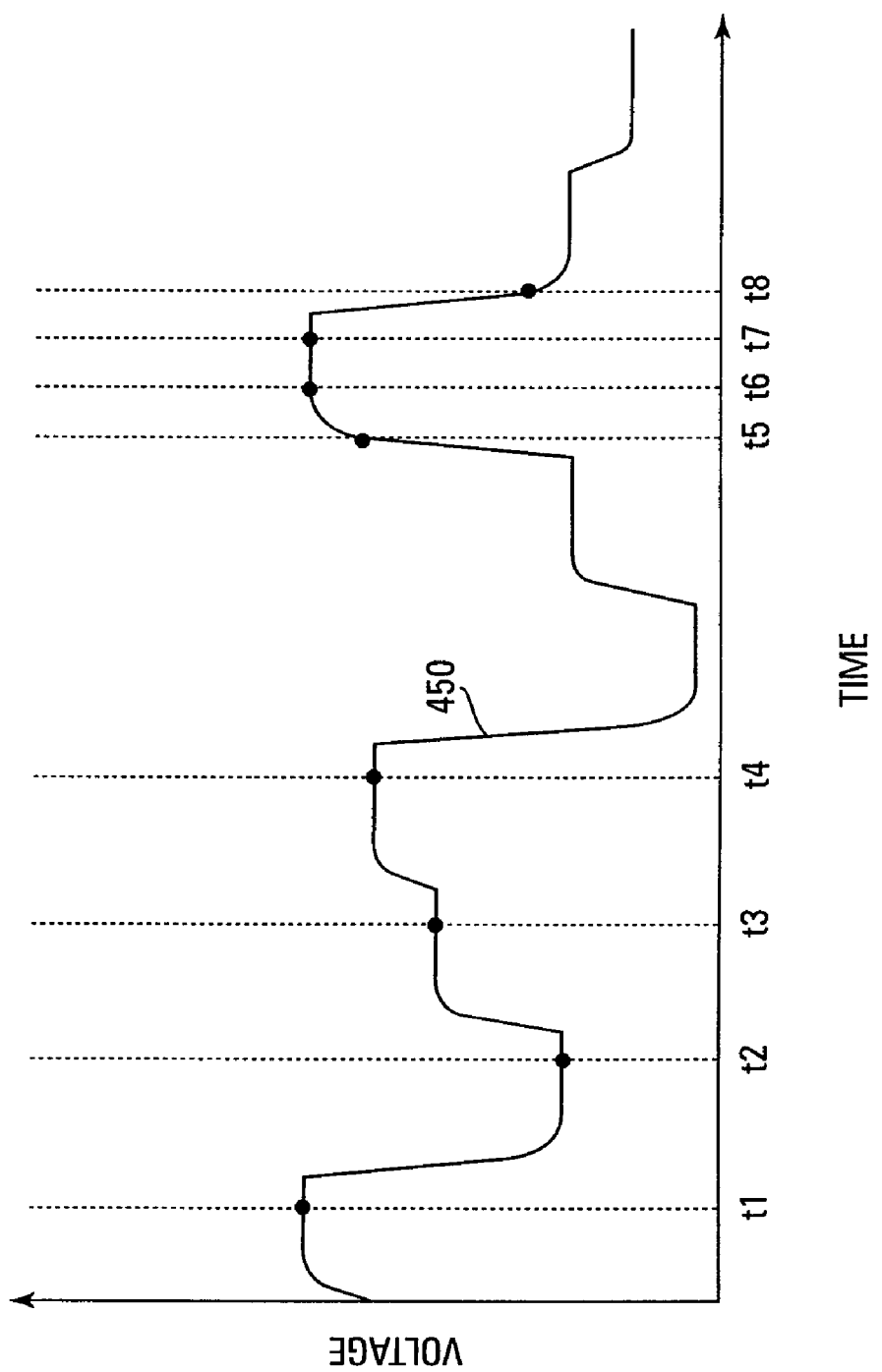
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
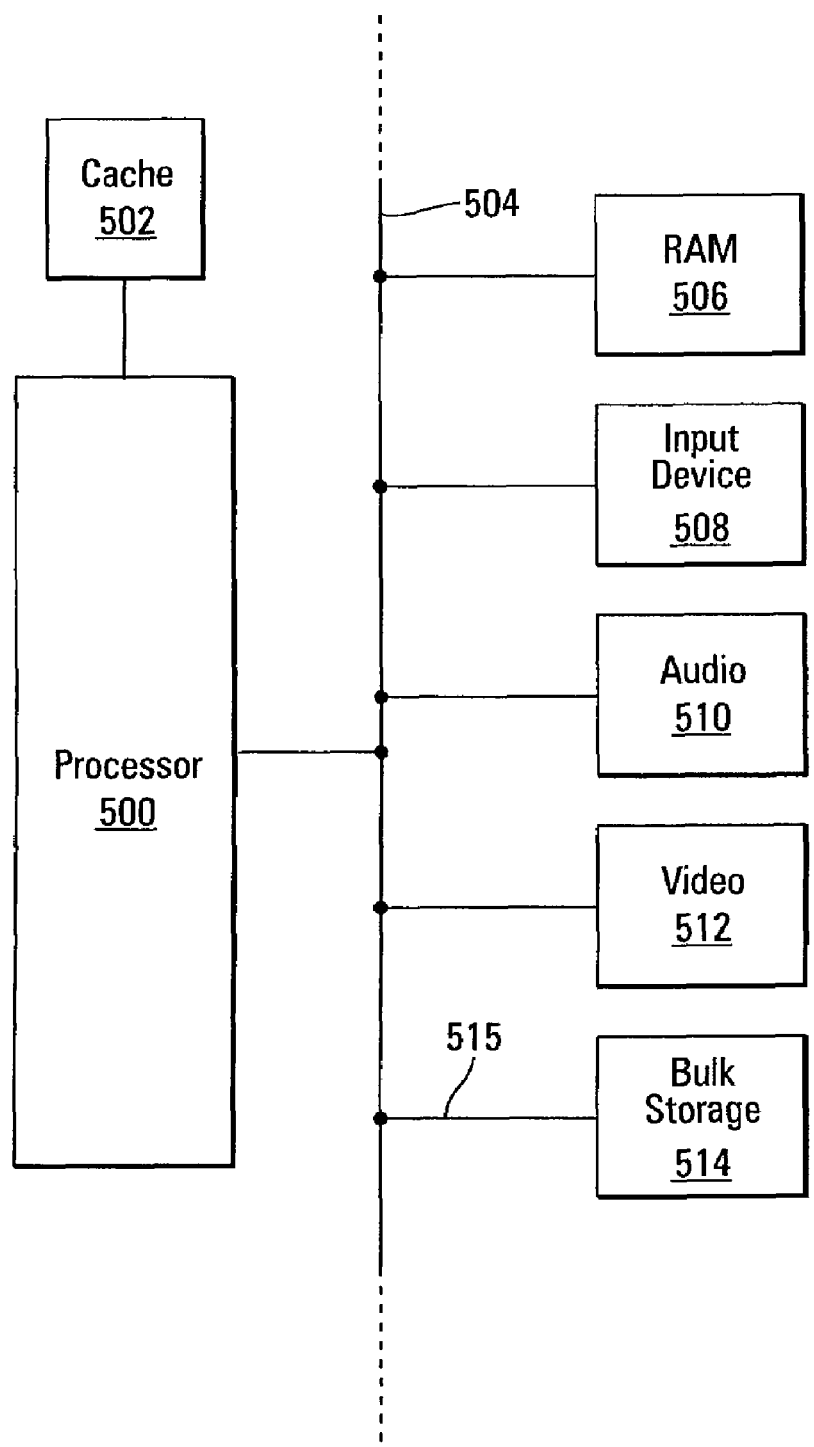
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

The non-volatile memory cells of the above-described memory array may have different rates of programming. Due to slight differences in the composition of each cell during the manufacturing process, the threshold voltages of some cells may increase at a different rate than others. This can cause problems when an entire word line of cells is biased with the same programming pulse in order to program data into the cells. The faster programming cells may end up over-programmed or the slower programming cells may end up under-programmed. Additionally, the greater number of program pulses necessary to increase the threshold voltage of the slower programming memory cell can cause a program disturb condition that affects other cells on the word line, increasing their threshold voltage. Therefore, the methods of the present disclosure control the rate of programming of the memory cells so that they are programmed at a more uniform rate.

FIG. 6 illustrates a flowchart of one embodiment of a method for cell programming rate detection and control. The method first detects and identifies the fast programming cells of the memory array 600.

The detection is accomplished by first reading the analog threshold voltage of each memory cell using a read operation. The word lines of the memory cells are then biased with a rate identification voltage that is less than a programming voltage but high enough to move the threshold voltage of the cells.

The rate identification voltage of the present disclosure needs to be low enough that memory cells are not programmed by the biasing. If a cell's threshold voltage is moved by the rate identification voltage or is moved a certain amount, then it can be assumed that that particular cell has a fast programming rate. For example, in a bulk semiconductor storage system in which a "normal" initial programming voltage is 16V, the rate identification voltage might be 15V.

After the rate identification biasing, the analog threshold voltage of each memory cells is read again to determine the difference between the pre-bias threshold voltage and the post-bias threshold voltage for each cell to be programmed. The cells with the greatest change in threshold voltage are considered to be fast programming rate cells. In one embodiment, each of the changes in threshold voltage is compared to a threshold voltage delta. Any cell having a threshold voltage change greater than the delta is a fast programming rate cell.

As previously described, the analog threshold voltages are analog data signals that are indicative of the threshold voltage of each memory cell. These analog data signals are converted to digital signals by an analog-to-digital conversion process. The resulting digital data signals are the digital representations of the threshold voltages that can be operated on by a controller circuit.

Once the memory cells having the faster programming rates are identified 600, indications of the locations of each of these cells are stored 603 for future reference during a programming operation. For example, a section of memory can be assigned to each memory block to store a table of indications of locations of the fast programming memory cells for that particular memory block. The indications of the locations can include logical addresses of the faster programming cells.

The table of fast programming memory cells can also contain an indication of the rate of programming associated with each fast programming cell. Even though all of the memory cells listed in the table are fast programming memory cells, each of those cells still program at different rates. Thus a programming rate indication can be stored that is associated with each memory cell location in the table. The programming rate indication represents the amount of change of the threshold voltage or the amount over the threshold voltage delta, associated with that particular cell, in response to the rate identification biasing.

The fast programming memory cells are programmed at a different rate than the slower memory cells 605. Changing the programming rate is accomplished by changing the biasing of the bit line coupled to the fast programming memory cells. A typical bit line enable voltage is ground potential and a typical bit line inhibit voltage is $V_{cc}$. Therefore, as the bit line bias increases from 0V, the programming speed for the memory cells coupled to the bit line decreases. In other words, increasing bit line bias slows the speed at which a cell's threshold voltage increases from a negative erased threshold voltage distribution.

As an example of operation, the controller accesses the table in memory when a program/write command is received containing an address. If the memory address is found in the table, that particular cell is assumed to be a faster programming cell and the bit line coupled to that cell is biased at a voltage higher than ground in order to slow its programming rate. The bit line bias voltage is determined by the programming rate associated with that cell and stored along with the cell in the memory table. The higher the associated programming rate, the higher the bit line bias voltage necessary to decrease the programming rate. If the cell or cells are not found in the table, they are assumed to be normal cells that require a bit line programming bias of 0V.

In one embodiment, during testing of each individual bulk storage system, a programming rate associated with a particular bit line voltage is determined for each faster programming memory cell. An algorithm can be used to determine a desired slower programming rate for a faster programming memory cell. The bit line bias voltage associated with this rate can then be used. The bit line bias voltage associated with a particular programming rate is stored in memory and can be associated with the particular memory cell to which it applies.

In an alternate embodiment, the memory cells labeled as having a fast programming rate can be marked as being defective. In such an embodiment, redundant memory columns would be used in place of the defective ones.

As previously described, the programming voltages generated by the controller are digital voltages indicative of the desired threshold voltage for a particular cell. The analog data signals are generated from these digital signals by a digital-to-analog conversion process.

FIG. 7 illustrates a flowchart of an alternate embodiment of a method for memory cell programming rate detection and control. This embodiment does not perform the preliminary identification as in the embodiment of FIG. 6.

A programming operation is initiated 700 by the controller circuit generating the digital signal representative of the desired threshold voltage to be programmed on each cell. The digital signal is converted to the analog representation of the threshold voltage that is then used to bias the word line of the respective memory cell.

The rate of programming for each cell is then determined 703. This is accomplished by reading the analog threshold voltage of each cell before and after the first programming pulse. The analog voltage for each read is converted to its digital representation by the analog-to-digital conversion process as discuss previously. The controller then calculates the difference between the two voltages to identify which cells have had their threshold voltages moved the most by the first programming pulse. The cells with the largest difference from one programming pulse are identified as fast programming cells. The bit lines coupled to these fast programming cells are biased as described previously to control the programming speed of the cell 705.

The difference between the pre-programming pulse threshold voltage and the post-programming pulse threshold voltage for each cell indicates the bit line bias necessary to control the programming rate (i.e., speed of movement of the threshold voltage) for that cell. The necessary bit line bias can be determined by empirical testing and storing of a table of bit line bias voltages with associated programming rate, as in the previous embodiment.

In an alternate embodiment, the necessary bit line bias to control the speed of programming can be determined dynamically as the cell is being programmed in response to trial and error. For example, the bit line can be biased at one voltage that is greater than 0V and a programming pulse applied to the word line/control gate of the memory cell being programmed. The threshold voltage for the cell can be read to determine the amount of movement and/or percentage of being programmed. The movement of the threshold voltage is then compared to the slower programming memory cells to determine if the different programming rates are substantially similar. The bit line bias can then be changed, if necessary, in response to these factors and another programming pulse issued. This process is repeated until the cell is programmed substantially simultaneously with the slower programming cells.

In one embodiment, the memory cells are programmed substantially simultaneously when the slower programming cells reach their respective programmed states within one programming pulse of the faster programming cells. Alternate embodiments may specify other quantities of programming pulses for the different programming rate cells to reach their respective programmed states substantially simultaneously.

The flowchart of FIG. 8 illustrates an embodiment of a method for identifying and controlling the programming rate of fast programming memory cells. Instead of detecting a rate of programming, as in other embodiments, this embodiment determines when a cell is too far ahead in programming in relation to other cells and slows the programming rate of the fast programming cells.

A programming operation is initiated 800 by the controller circuit generating the digital signal representative of the desired threshold voltage to be programmed on each cell. The digital signal is converted to the analog representation of the threshold voltage that is then used to bias the word line of the respective memory cell.

The controller circuit then determines which memory cells being programmed have a threshold voltage that is closer to being in its programmed state than the other cells 803. For example, one cell might start with an erased threshold voltage of −1V and is being programmed to a desired programmed state having a threshold voltage of 1V. Another cell might start with an erased threshold voltage of −3V and is being programmed to a desired programmed state having a threshold voltage of 3V. The memory cell with the smallest voltage swing will require the fewest number of program pulses but will still have to endure the extra program pulses of the cell or cells having larger threshold voltage swings. This could cause a program disturb condition in the cell that is being programmed faster.

Since different cells might be programmed to different threshold voltages, as in the previous example, the controller circuit takes into account the percentage of completion of programming for each memory cell being programmed. Thus, if one memory cell is closer to reaching its programmed analog threshold voltage than other cells being programmed, the controller circuit slows the programming of that cell until the other cells catch up with the faster programming cell 805. As in previous embodiments, the programming rate control mechanism is an increase in the bit line bias above ground potential. The bit line bias is adjusted as required so that the faster programming cells and the slower programming cells reach their respective programmed states' threshold voltages substantially simultaneously.

In one embodiment, the memory cells are programmed substantially simultaneously when the cells that program at a slower rate reach their respective programmed states within one programming pulse of the faster programming cells. Alternate embodiments may specify other quantities of programming pulses for the different programming rate cells to reach their respective programmed states substantially simultaneously.

Figure 9:
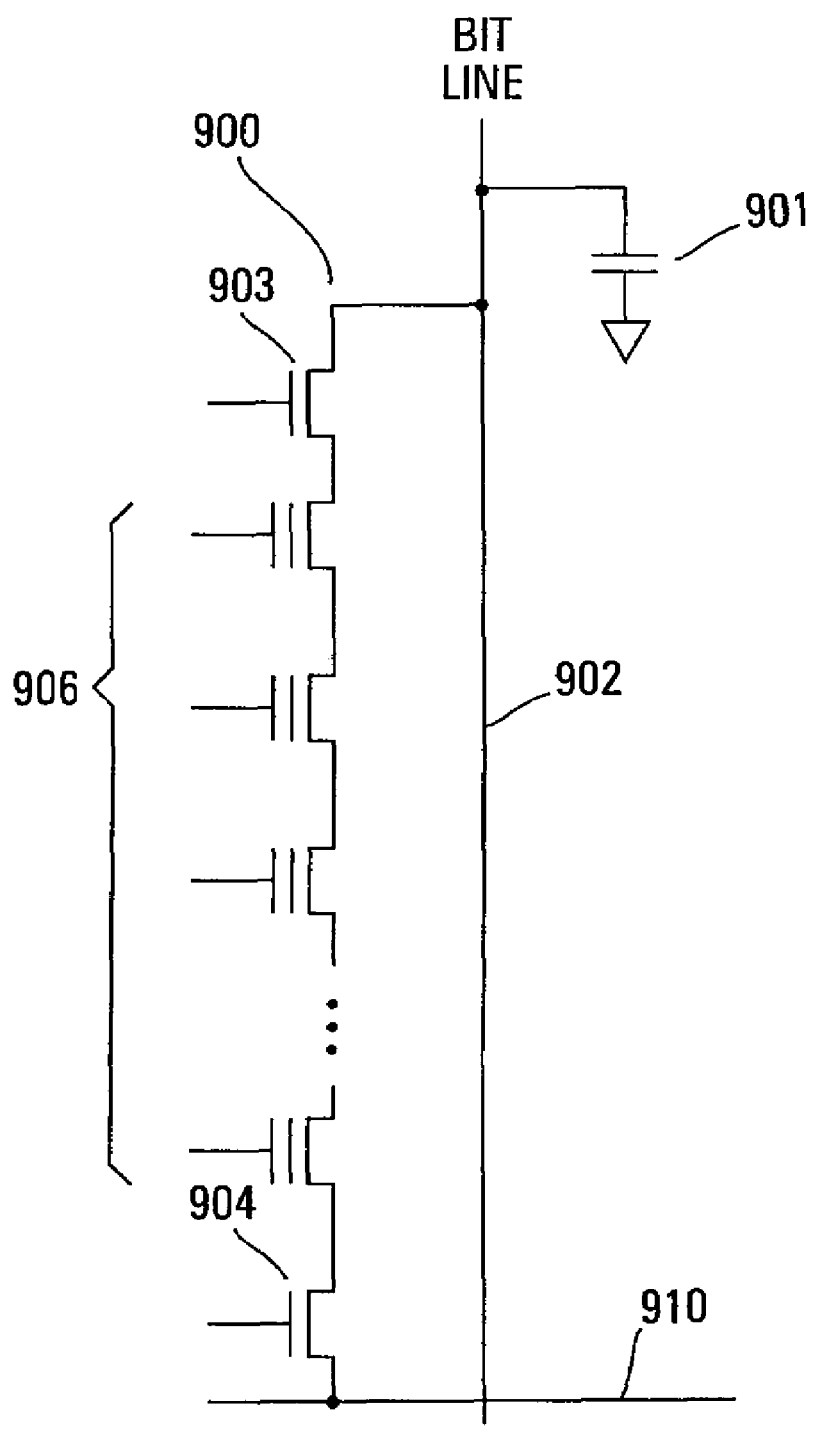
FIG. 9 is a schematic of one embodiment of a portion of a NAND memory array with an attached biasing capacitor.

FIG. 9 illustrates a schematic of one embodiment of a circuit for controlling and maintaining the particular bit line biasing necessary to adjust the programming rate of memory cells coupled to their respective bit line. This figure shows a typical bit line 902 and its coupled memory cells 906 as illustrated and discussed previously with reference to FIG. 2. As in previous embodiments, the bit line 902 is coupled to the string of memory cells 906 through a select gate drain transistor 903. The end of the memory cell string 906 is coupled to the source line 910 through a select gate source transistor 904. The function of these elements has been discussed previously.

A capacitor 901 is coupled to each bit line 902 of the array in order to maintain a desired bit line biasing voltage during a program operation of the cells coupled to the bit line. During a program operation, the capacitor 901 is biased with the desired bit line voltage and it then maintains this voltage for the duration of the programming operation. When it is desired to change the bit line biasing voltage for either the same memory cell being programmed or another cell on a different word line being programmed, another voltage is written to the capacitor 901. This circuit frees a controller from having to continuously maintain an appropriate bias on the selected bit lines.

Figure 10:
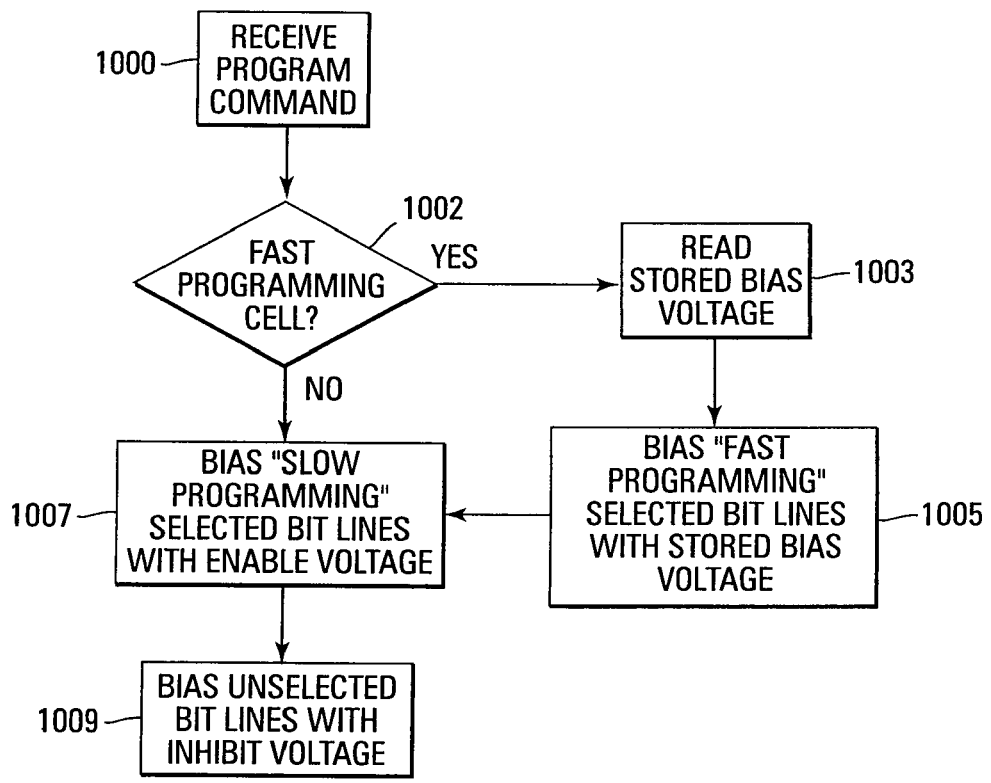
FIG. 10 is a flowchart of another embodiment of a method for programming a memory device of the present disclosure.

FIG. 10 illustrates an embodiment for programming a memory device by adjusting the rate of programming of faster programming memory cells. The memory device is comprised of sections of memory that store the addresses and desired bit line bias voltages, as discussed previously, of faster programming memory cells.

The memory device receives a program/write command that contains an address of a memory cell and the data value to program 1000. The controller circuit reads the memory to determine if the received address has been stored as a faster programming memory cell 1002. If the received address is found as being a faster programming memory cell, the voltage data describing the bit line bias that is associated with that address is read from memory 1003. This is the voltage that was previously found to cause the associated memory cell to program at the desired rate. The voltage data is used to generate the bit line bias for the selected bit line coupled to the faster programming memory cell 1005.

The bit lines for the slower programming memory cells are biased with the enable voltage 1007. In one embodiment, this voltage is 0V. The remaining, unselected bit lines are biased with the inhibit voltage of $V_{CC}$ 1009.

CONCLUSION

The various embodiments include memory devices adapted to receive and transmit analog data signals representative of bit patterns of two or more bits. The memory devices can be programmed using methods that determine a rate of programming of the memory cells and adjust the programming rate of those cells that are being programmed at a faster rate than other cells. By adjusting the bit line bias above 0V, the speed at which the threshold voltage changes can be varied. A desired bit line bias that corresponds to the desired programming speed can be applied to a capacitor on the bit line. The capacitor then maintains this bit line bias for the duration of the programming operation or until it is changed again.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method for programming rate identification and control in a solid state memory comprising an array of memory cells having columns of memory cell coupled to bit lines, the method comprising:
   identifying memory cells of the array that program at a faster rate than the remaining memory cells of the array; and
   causing the memory cells that program at the faster rate to reach their respective programmed states at a substantially similar programming rate as the remaining memory cells by adjusting biasing of selected bit lines.

2. The method of claim 1 and further including storing an indication of a location of each identified memory cell that programs at the faster rate.

3. The method of claim 2 and further including storing an indication of a bit line bias voltage associated with the indication of the location.

4. The method of claim 1 wherein the programmed states are part of distributions of threshold voltages.

5. The method of claim 4 wherein each threshold voltage is represented by an analog voltage.

6. The method of claim 1 and further including reading an analog threshold voltage from each memory cell during programming and converting the analog threshold voltage to a digital representation of the analog threshold voltage.

7. A method for controlling programming rates of memory cells in a solid state memory comprising a plurality of bit lines coupled to columns of memory cells, the method comprising:
   identifying a programming rate for each of the memory cells to determine faster programming memory cells and slower programming memory cells;
   storing an indication of a location of each faster programming memory cell; and
   changing the programming rate of the faster programming memory cells by increasing a selected bit line bias voltage, coupled to the faster programming memory cells, such that the bias voltage is greater than a bit line enable voltage.

8. The method of claim 7 and further including:
   receiving a program command comprising a logical address; and
   accessing the stored indications of the locations of each of the faster programming memory cells in memory to determine if the logical address matches any of the indications of the locations of the faster programming memory cells.

9. The method of claim 7 and further including storing an indication of the programming rate associated with each faster programming memory cell.

10. The method of claim 7 and further including storing an indication of the bit line bias voltage, associated with each faster programming memory cell, that provides a predetermined programming rate.

11. A method for controlling programming rates of memory cells in a non-volatile solid state memory comprising a plurality of bit line columns of memory cells, the method comprising:
   determining a programming rate for each of the memory cells such that the memory cells are either faster programming memory cells or slower programming memory cells; and
   programming, substantially simultaneously, a faster programming memory cell and a slower programming memory cell while adjusting the programming rate of the faster programming memory cell in response to biasing a selected bit line coupled to the faster programming memory cell with a voltage that is greater than an enable voltage such that the slower programming memory cell and the faster programming memory cell reach their respective programmed states substantially simultaneously.

12. The method of claim 11 and further including receiving a digital representation of a desired threshold voltage.

13. The method of claim 11 wherein the enable voltage is ground potential and the voltage is greater than ground potential and less than $V_{CC}$.

14. The method of claim 11 wherein determining the programming rate comprises:
   applying a programming pulse to each of the memory cells; and
   determining a change in threshold voltage for each memory cell such that memory cells with a greater change in threshold voltage than remaining memory cells are faster programming memory cells and the remaining memory cells are the slower programming memory cells.

15. The method of claim 14 wherein the threshold voltages are determined by reading an analog voltage that is indicative of the threshold voltage.

16. The method of claim 15 wherein the analog voltage is converted to a digital value that is indicative of a threshold voltage by a digital-to-analog conversion process.

17. A method for controlling programming rate of memory cells in a non-volatile solid state memory comprising a plurality bit lines, each bit line coupled to a column of memory cells, the method comprising:
   reading a first threshold voltage prior to a first programming pulse for each of the memory cells;
   applying the first programming pulse to each of the memory cells;
   reading a second threshold voltage after the first programming pulse for each of the memory cells;
   determining a difference between the first and second threshold voltages to find faster programming memory cells and slower programming memory cells wherein the faster programming memory cells have a greater difference between the first and second threshold voltages than the slower programming memory cells; and
   biasing a selected bit line, coupled to each of the faster programming memory cells, with a voltage that is greater than an enable voltage and less than an inhibit voltage such that the programming rate of the faster programming memory cells is decreased.

18. The method of claim 17 and further comprising converting the first and second threshold voltages to digital signals indicative of the first and second threshold voltages.

19. The method of claim 17 wherein biasing comprises writing the voltage to a capacitor coupled to the selected bit line such that the capacitor holds the voltage on the selected bit line during programming.

20. A method for controlling programming of memory cells in a non-volatile solid state memory comprising a plurality of bit line columns and a plurality of word line rows, the method comprising:

biasing a selected word line coupled to the memory cells with a programming pulse;

reading an analog threshold voltage for each of the memory cells;

determining faster programming memory cells having an analog threshold voltage greater than a predetermined threshold and slower programming memory cells having an analog threshold voltage less than the predetermined threshold; and biasing first selected bit lines coupled to the faster programming memory cells with a voltage greater than an enable voltage and less than an inhibit voltage and second selected bit lines coupled to the slower programming memory cells with the enable voltage such that each of the memory cells coupled to the selected word line that are being programmed reach their respective programmed state threshold voltage substantially simultaneously.

21. The method of claim 20 and further including receiving an analog representation of a desired threshold voltage for each of the memory cells to be programmed that are coupled to the selected word line.

22. A method for programming memory cells in a non-volatile, solid state memory organized in a plurality of bit line columns and a plurality of word line rows, the method comprising:

receiving a program command comprising a received memory cell address and a data value having a programmed state;

if the received memory cell address is equal to a stored memory cell address of a faster programming memory, reading stored bit line voltage data, associated with the stored memory cell address, from memory; and biasing a selected bit line coupled to the received memory cell address in response to the stored bit line voltage data.

23. The method of claim 22 and further including biasing unselected bit lines with an inhibit voltage and remaining, selected bit lines with an enable voltage.

24. A solid state memory device, comprising:

an array of non-volatile memory cells having columns of memory cells coupled to bit lines and rows of memory cells coupled to word lines; and circuitry for control and access of the array of non-volatile memory cells wherein the circuitry for control and access is adapted to control a rate of programming of the array of non-volatile memory cells by generating a selected bit line bias greater than an enable voltage and in response to a rate of change of a threshold voltage of each of the memory cells.

25. The solid state memory device of claim 24 wherein the circuitry for control and access is further adapted to read analog data signals from the memory cells being programmed and to generate digital threshold voltage signals indicative of the read analog data signals.

26. The solid state memory device of claim 24 and further including a biasing capacitor coupled to each bit line wherein the circuitry for control and access is further adapted to write the selected bit line bias to the biasing capacitor during a programming operation.

27. The solid state memory device of claim 24 wherein the circuitry for control and access of the array of non-volatile memory cells comprises circuitry to receive a digital data signal indicative of a programmed memory state and to convert the digital data signal to an analog data signal indicative of a threshold voltage of the programmed memory state.

28. The solid state memory device of claim 24 wherein the array of non-volatile memory cells is organized in a NAND architecture.

29. A method for identifying and controlling programming rate in a solid state memory having an array of memory cells, the method comprising:

identifying memory cells of the array that program at a faster rate than the remaining memory cells of the array; and causing the memory cells that program at the faster rate to reach their respective programmed states substantially simultaneously with the remaining memory cells reaching their respective programmed states.

30. The method of claim 29 and further including storing an indication of a location of each identified memory cell that programs at the faster rate.

* * * * *

UNITED STATES PATENT AND TRADEMARK OFFICE
CERTIFICATE OF CORRECTION

PATENT NO. : 7,630,246 B2  
APPLICATION NO. : 11/764450  
DATED : December 8, 2009  
INVENTOR(S) : Frankie F. Roohparvar It is certified that error appears in the above-identified patent and that said Letters Patent is hereby corrected as shown below:

In column 16, line 38, in Claim 17, before "bit" insert -- of --.

Signed and Sealed this

Sixteenth Day of February, 2010

David J. Kappos
*Director of the United States Patent and Trademark Office*